(12) United States Patent
Klepser et al.

(10) Patent No.: US 9,246,722 B2
(45) Date of Patent: Jan. 26, 2016

(54) DEVICE FOR PROVIDING A DIFFERENTIAL OUTPUT SIGNAL AND METHOD FOR PROVIDING A DIFFERENTIAL OUTPUT SIGNAL

(71) Applicant: Intel Mobile Communications GmbH, Neubiberg (DE)

(72) Inventors: Bernd-Ulrich Klepser, Starnberg (DE); Martin Simon, Otterfing (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 13/837,986

(22) Filed: Mar. 15, 2013

(65) Prior Publication Data

US 2013/0251062 A1    Sep. 26, 2013

Related U.S. Application Data

(60) Provisional application No. 61/613,102, filed on Mar. 20, 2012.

(30) Foreign Application Priority Data

Mar. 20, 2012 (DE) .......................... 10 2012 204 448
Mar. 20, 2012 (DE) .......................... 10 2012 204 450
Mar. 20, 2012 (DE) .......................... 10 2012 204 451

(51) Int. Cl.
*H04L 27/00* (2006.01)
*H04L 25/02* (2006.01)
(Continued)

(52) U.S. Cl.
CPC ............ *H04L 27/00* (2013.01); *H04L 25/0282* (2013.01); *H04L 27/20* (2013.01); *H04B 1/0475* (2013.01); *H04B 1/30* (2013.01)

(58) Field of Classification Search
CPC ........... H04L 5/00; H04L 15/00; H04L 17/00; H04L 25/0282; H04B 1/00; H04B 3/00; H04B 5/00; H04B 7/00; H04B 10/00; H04B 13/00; H04B 14/00; H04B 1/1615; H03F 2003/45022
USPC ............ 375/295, 315, 318, 312, 308; 330/10; 326/83; 327/539; 323/284, 282
See application file for complete search history.

(56) References Cited

U.S. PATENT DOCUMENTS 4,399,557 A * 8/1983 Muszkiewicz .................. 455/82
4,972,440 A  11/1990 Ernst et al.
(Continued)

FOREIGN PATENT DOCUMENTS

CN   102158211 A   8/2011
EP       233950 A1   9/1987

OTHER PUBLICATIONS

U.S. Appl. No. 13/835,693, filed Mar. 15, 2013. 58 Pages.
(Continued)

*Primary Examiner* — Emmanuel Bayard
(74) *Attorney, Agent, or Firm* — Eschweiler & Associates, LLC

(57) ABSTRACT

A device, which provides a differential output signal having a first output signal component and a second output signal component based on a plurality of input signals, includes a pair of signal sources and a controller. The pair of signal sources includes a first activatable signal source for providing the first output signal component and a second activatable signal source for providing the second output signal component. The controller is operably coupled to the pair of signal sources and is configured to activate either the first signal source or the second signal source of the pair of signal sources depending on the plurality of input signals.

26 Claims, 7 Drawing Sheets

(51) Int. Cl.
*H04L 27/20* (2006.01)
*H04B 1/04* (2006.01)
*H04B 1/30* (2006.01)

(56) References Cited

U.S. PATENT DOCUMENTS

| | | | |
|---|---|---|---|
| 5,323,356 A * | 6/1994 | Okunaga | 365/230.01 |
| 5,751,142 A * | 5/1998 | Dosho et al. | 323/316 |
| 5,781,035 A * | 7/1998 | Tashibu | 326/126 |
| 5,847,623 A | 12/1998 | Hadjichristos | |
| 5,939,931 A * | 8/1999 | Noro | 327/424 |
| 6,014,329 A * | 1/2000 | Akaogi et al. | 365/185.09 |
| 6,046,551 A * | 4/2000 | Kita | 315/307 |
| 6,058,292 A * | 5/2000 | Terreault | 455/78 |
| 6,259,901 B1 | 7/2001 | Shinomiya et al. | |
| 6,546,044 B1 | 4/2003 | Dent | |
| 6,774,683 B2 * | 8/2004 | Schafferer | 327/130 |
| 6,865,382 B2 * | 3/2005 | Behzad | 455/323 |
| 7,038,487 B2 * | 5/2006 | Ingino et al. | 326/30 |
| 7,176,910 B2 * | 2/2007 | Tsuchi | 345/204 |
| 7,233,165 B2 * | 6/2007 | Jordy | 326/29 |
| 7,248,115 B2 * | 7/2007 | Nishimura | 330/253 |
| 7,304,517 B2 * | 12/2007 | Kim et al. | 327/175 |
| 7,345,932 B2 * | 3/2008 | Pan | 365/189.09 |
| 7,457,606 B2 * | 11/2008 | Kim | H03D 7/1441 455/323 |
| 7,460,612 B2 | 12/2008 | Eliezer et al. | |
| 7,471,107 B1 * | 12/2008 | Fortin et al. | 326/83 |
| 7,609,779 B2 | 10/2009 | Wagh et al. | |
| 7,616,030 B2 * | 11/2009 | Lee | 327/141 |
| 7,808,841 B2 * | 10/2010 | Choi et al. | 365/189.05 |
| 8,159,301 B1 * | 4/2012 | Duffy et al. | 330/253 |
| 8,179,109 B2 * | 5/2012 | Tang et al. | 323/282 |
| 8,185,067 B2 * | 5/2012 | Mattisson et al. | 455/118 |
| 8,331,875 B2 * | 12/2012 | Hosoya | 455/73 |
| 8,565,344 B2 | 10/2013 | Kitamura et al. | |
| 8,620,242 B2 * | 12/2013 | Mirzaei et al. | 455/127.2 |
| 2001/0024133 A1 * | 9/2001 | Killat et al. | 327/112 |
| 2002/0057082 A1 * | 5/2002 | Hwang | 323/284 |
| 2003/0002594 A1 | 1/2003 | Harel et al. | |
| 2003/0054779 A1 * | 3/2003 | Losser et al. | 455/127 |
| 2003/0117209 A1 * | 6/2003 | Tsuchiya et al. | 327/530 |
| 2004/0095976 A1 * | 5/2004 | Bowler et al. | 372/38.02 |
| 2004/0155892 A1 * | 8/2004 | Tsuchi | 345/690 |
| 2005/0190856 A1 | 9/2005 | Kroebel et al. | |
| 2005/0212791 A1 * | 9/2005 | Tsuchi | G09G 3/3685 345/211 |
| 2006/0023518 A1 * | 2/2006 | Iwata | 365/189.07 |
| 2006/0057991 A1 * | 3/2006 | Behzad et al. | 455/234.1 |
| 2006/0170495 A1 * | 8/2006 | Stephelbauer et al. | 330/254 |
| 2006/0220685 A1 * | 10/2006 | Jordy | 326/83 |
| 2007/0004351 A1 | 1/2007 | Dekker | |
| 2007/0042728 A1 * | 2/2007 | Pan | 455/127.1 |
| 2007/0087711 A1 * | 4/2007 | Pan | 455/127.4 |
| 2007/0126500 A1 * | 6/2007 | Mattisson et al. | 330/10 |
| 2008/0299919 A1 | 12/2008 | Mow et al. | |
| 2009/0067278 A1 * | 3/2009 | Choi et al. | 365/230.06 |
| 2009/0130993 A1 | 5/2009 | Rofougaran et al. | |
| 2010/0188920 A1 * | 7/2010 | Futatsuyama et al. | 365/226 |
| 2010/0195765 A1 * | 8/2010 | Lin et al. | 375/308 |
| 2011/0133841 A1 * | 6/2011 | Shifrin | 330/279 |
| 2011/0170885 A1 * | 7/2011 | Cho et al. | 399/37 |
| 2011/0181264 A1 * | 7/2011 | Aiura | 323/288 |
| 2011/0188604 A1 | 8/2011 | Wagner | |
| 2011/0193543 A1 * | 8/2011 | Nguyen | 323/285 |
| 2011/0298541 A1 * | 12/2011 | Shi | 330/261 |
| 2012/0115426 A1 * | 5/2012 | Andrys et al. | 455/127.1 |
| 2012/0213237 A1 * | 8/2012 | Mactaggart | 372/38.02 |
| 2012/0274153 A1 * | 11/2012 | Maxwell et al. | 307/126 |
| 2013/0088473 A1 * | 4/2013 | Tsuchi | 345/211 |
| 2013/0107769 A1 * | 5/2013 | Khlat et al. | 370/310 |
| 2013/0127530 A1 * | 5/2013 | Ni et al. | 330/251 |
| 2013/0141064 A1 * | 6/2013 | Kay et al. | 323/271 |
| 2013/0141068 A1 * | 6/2013 | Kay et al. | 323/282 |
| 2013/0154737 A1 * | 6/2013 | Shu | 330/253 |
| 2014/0063639 A1 * | 3/2014 | Dean | 360/68 |

OTHER PUBLICATIONS

U.S. Appl. No. 13/834,736, filed Mar. 15, 2013. 77 Pages.
Alavi, M.S.; Staszewski, R.B.; De Vreede, L. C N; Long, J.R., "Orthogonal summing and power combining network in a 65-nm all-digital RF I/Q modulator," Radio-Frequency Integration Technology (RFIT), 2011 IEEE International Symposium on Radio-Frequency Integration Technology, pp. 21,24, Nov. 30, 2011-Dec. 2 2011. 4 Pages.
Staszewski, R.B.; Alavi, M.S., "Digital I/Q RF transmitter using time-division duplexing," Symposium on Radio-Frequency Integration Technology (RFIT), 2011 IEEE International pp. 165,168, Nov. 30 2011-Dec. 2 2011. 4 Pages.
Office Action Dated May 2, 2014 U.S. Appl. No. 13/835,693.
Notice of Allowance Dated Aug. 1, 2014 U.S. Appl. No. 13/835,693.
Non Final Office Action Dated Sep. 22, 2014 U.S. Appl. No. 13/834,736.
Final Office Action Dated Apr. 8, 2015 U.S. Appl. No. 13/834,736.
Notice of Allowance Dated Aug. 28, 2015 U.S. Appl. No. 13/834,736.

* cited by examiner

| 103a-1 | 103b-1 | 115a-1 | 115b-1 |
|--------|--------|--------|--------|
| In, n+ | In, n- | Out, n+ | Out, n- |
| 0 | 0 | 0 | 0 |
| 0 | 1 | 0 | 1 |
| 1 | 0 | 1 | 0 |
| 1 | 1 | 0 | 0 |

FIG 1B

DEVICE FOR PROVIDING A DIFFERENTIAL OUTPUT SIGNAL AND METHOD FOR PROVIDING A DIFFERENTIAL OUTPUT SIGNAL

REFERENCE TO RELATED APPLICATIONS

This application claims priority to U.S. application No. 61/613,102 filed on Mar. 20, 2012. German patent application number DE 10 2012 2044 51.5 filed on Mar. 20, 2012, German patent application number DE 10 2012 2044 50.7 filed on Mar. 20, 2012, and German patent application number DE 10 2012 2044 48.5 filed on Mar. 20, 2012.

FIELD

Exemplary embodiments of the present disclosure provide a device for providing a differential output signal having a first output signal component and a second output signal component based on a plurality of input signals. Further exemplary embodiments provide a method for providing a differential output signal. Exemplary embodiments of the present disclosure can be used in digital-to-analogue converters, for example. Further exemplary embodiments provide a mobile radio device.

BACKGROUND

In digital radio-frequency transmission architectures, different digitally controlled signal paths can be combined at a common output load. A typical example of such a transmission architecture is a digital direct modulator. On account of the overlap of I-Q clock signals or digital noise shaping, it can happen that part of the signal current is generated in both sides of the differential load, which leads to an undesired common-mode signal or self-cancellation of the signal. Since this portion of the signal does not generate a desired RF signal, the current consumption of the modulator increases and, furthermore, the efficiency is reduced by the current required for generating this undesired portion.

SUMMARY

Therefore, it is an object of exemplary embodiments of the present disclosure to provide a concept which enables a differential output signal to be provided more efficiently.

Exemplary embodiments of the present disclosure provide a device for providing a differential output signal having a first output signal component and a second output signal component based on a plurality of input signals. The device comprises a pair of signal sources comprising a first activatable signal source for providing the first output signal component and a second activatable signal source for providing the second output signal component. Furthermore, the device has a controller, which is operably coupled to the pair of signal sources and is configured to activate either the first signal source or the second signal source of the pair of signal sources depending on the plurality of input signals.

Further exemplary embodiments of the present disclosure provide a mobile radio device. Further exemplary embodiments of the present disclosure provide a method for providing a differential output signal.

BRIEF DESCRIPTION OF THE DRAWINGS

Exemplary embodiments of the present disclosure are described in detail hereinafter with reference to the accompanying figures, in which:

FIG. 1B shows an example of a drive table such as can be used in exemplary embodiments of the present disclosure in a controller for driving signal sources;

DETAILED DESCRIPTION

Before exemplary embodiments of the present disclosure are described in detail hereinafter, it is pointed out that identical elements or elements having an identical function are provided with the same reference signs in the figures, and that descriptions of elements having the same reference signs are mutually interchangeable. Therefore, a repeated description of elements provided with the same reference signs will be dispensed with.

Figure 1A:
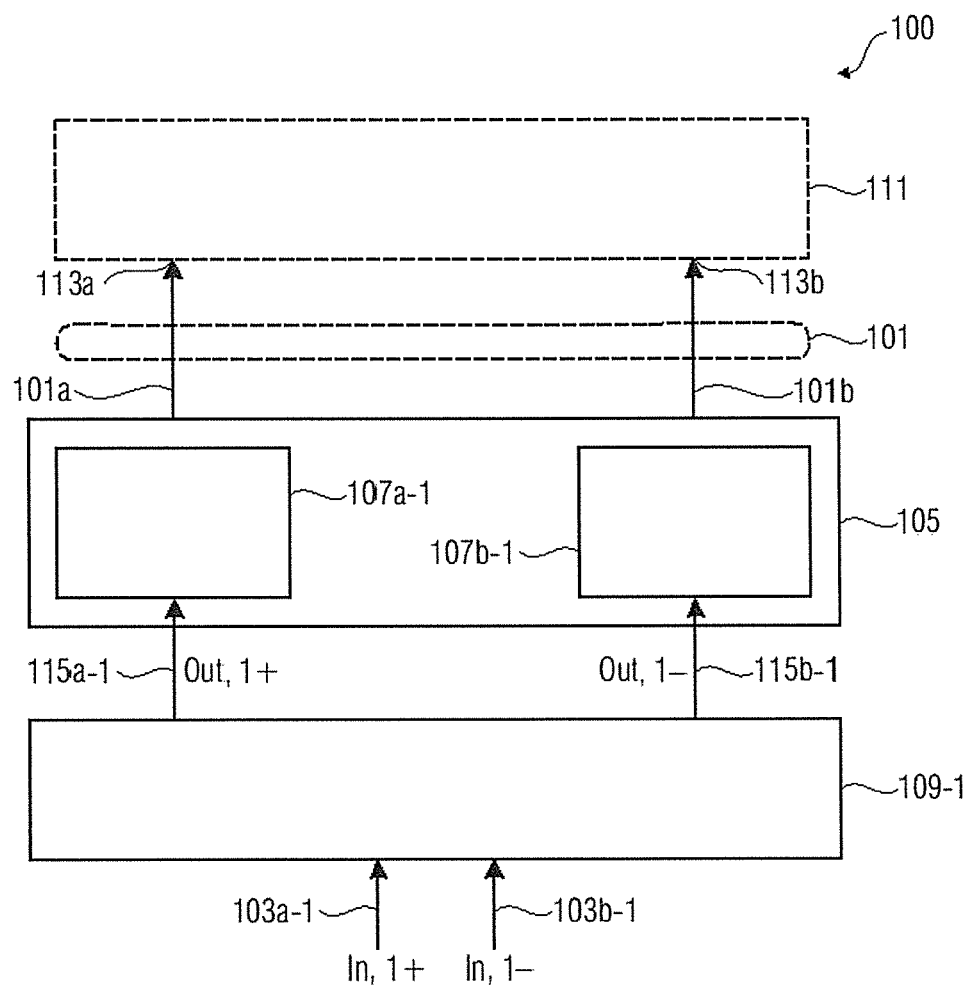
FIG. 1A shows a block diagram of a device in accordance with one exemplary embodiment of the present disclosure.

FIG. 1A shows a block diagram of a device 100 for providing a differential output signal 101 in accordance with one exemplary embodiment of the present disclosure. The differential output signal 101 has a first output signal component 101a and a second output signal component 101b. By way of example, the differential output signal 101 can be obtained by subtracting the first output signal component 101a from the second output signal component 101b. The device 100 is designed to provide the differential output signal 101 based on a plurality of input signals 103a-1-103b-1. The device 100 comprises a pair 105 of signal sources 107a-1, 107b-1. The pair 105 of signal sources 107a-1, 107b-1 comprises a first activatable signal source 107a-1 for providing the first output signal component 101a and a second activatable signal source 107b-1 for providing the second output signal component 101b. Furthermore, the device 100 comprises a controller 109-1. The controller 109-1 is operably coupled to the pair 105 of signal sources 107a-1, 107b-1 and is configured to activate either the first signal source 107a-1 or the second signal source 107b-1 of the pair 105 of signal sources 107a-1, 107b-1 depending on the plurality of input signals 103a-1, 103b-1. In other words, the controller 109-1 can be designed, depending on the plurality of input signals 103a-1, 103b-1, to activate the signal sources 107a-1, 107b-1 in such a way that (apart from at changeover instants) at an instant either none of the two signal sources 107a-1, 107b-1 of the pair 105 of signal sources 107a-1, 107b-1 is active or a maximum of one of the two signal sources 107a-1, 107b-1 of the pair 105 of signal sources 107a-1, 107b-1 is active.

The output signal components 101a, 101b can be provided by the signal sources 107a-1, 107b-1 at a common load 111 coupled to the signal sources 107a-1, 107b-1. For example, in one case the output signal components 101a, 101b may be superposed (in a signed manner) at the common load 111. In this case, in accordance with some exemplary embodiments, the common load 111 can be part of the device 100, but can also be external to the device 100.

Device 100 allows for a common-mode suppression to be achieved at the common load 111 if the controller 109-1 is designed such that, independently of the input signals 103a-1, 103b-1, the output signal components 101a, 101b provided by the signal sources 107a-1, 107b-1 cannot be cancelled at the common load 111. In exemplary embodiments of the present disclosure this is achieved by virtue of the fact that the controller 109-1 is designed to activate either the first signal source 107a-1 of the pair 105 of signal sources 107a-1, 107b-1 or the second signal source 107b-1 of the pair 105 of signal sources 107a-1, 107b-1 depending on the input signals 103a-1, 103b-1. This avoids the situation where both signal sources 107a-1, 107b-1 of the pair 105 of signal sources 107a-1, 107b-1 are simultaneously active, which would have the effect that both signal sources 107a-1, 107b-1 provide an output signal component 101a, 101b, which would cancel one another in the resulting differential output signal 101 (at the common load 111) and, therefore, would not contribute to the information content of the differential output signal 101. In other words, the controller 109-1 can be designed, in the cases in which the input signals 103a-1, 103b-1 have a value which would have the effect that both signal sources 107a-1, 107b-1 of the pair 105 of signal sources 107a-1, 107b-1 are activated, to activate neither of the two signal sources 107a-1, 107b-1 of the pair 105 of signal sources 107a-1, 107b-1. This does not lead here to a loss of information in the resulting differential output signal 101, since the two output signal components 101a, 101b provided simultaneously by the signal sources 107a-1, 107b-1 would have cancelled one another anyway in the resulting differential output signal 101, but rather leads, in contrast to conventional systems, to a significant reduction of the current consumption of the device 100.

In accordance with some exemplary embodiments, the common load 111 can comprise or form an inductive load, a resistive load, and/or a capacitive load. In this case, the first signal source 107a-1 of the pair 105 of signal sources 107a-1, 107b-1 can be connected to a first terminal 113a of said inductive, capacitive or resistive load and the second signal source 107b-1 of the pair 105 of signal sources 107a-1, 107b-1 can be connected to a second terminal 113b of said inductive, capacitive or resistive load. An inductive load can be, for example, a differential inductive load or a differential transformer or a resonator.

In accordance with some exemplary embodiments, the signal sources 107a-1, 107b-1 can be voltage sources or current sources. A pair of signal sources, such as the pair 105 of signal sources 107a-1, 107b-1 as shown in FIG. 1, can be distinguished by the fact that a magnitude of a current or of a voltage which is provided by the first signal source 107a-1 of the pair 105 of signal sources 107a-1, 107b-1 in its activated state is (within a tolerance range of ±1%, ±5%, ±10% or ±20% of the current provided by the first signal source 107a-1 or of the voltage provided by the first signal source 107a-1) equal to a current or equal to a voltage which is provided by the second signal source 107b-1 of the pair 105 of signal sources 107a-1, 107b-1 in its activated state.

To summarize, a current provided by the first signal source 107a-1 or a voltage provided by the first signal source 107a-1 can be (in terms of magnitude) equal to a current provided by the second signal source 107b-1 or a voltage provided by the second signal source 107b-1.

In some cases, a sign of the current provided by the first signal source 107a-1 or of the voltage provided by the first signal source 107a-1 can differ from a sign of the current provided by the second signal source 107b-1 or of the voltage provided by the second signal source 107b-1.

In accordance with some exemplary embodiments, the controller 109-1 can be designed to receive a first input signal 103a-1 (also designated as In, 1+) for the first signal source 107a-1 and to receive a second input signal 103b-1 (also designated as In, 1−) for the second signal source 107b-1. Furthermore, the controller 109-1 can be designed, in a case in which a value (e.g., a digital value) of the first input signal 103a-1 corresponds to a value (e.g., a digital value) of the second input signal 103b-1 (e.g., is equal to the latter), independently of the value of the first input signal 103a-1 or of the second input signal 103b-1, to activate none of the signal sources 107a-1, 107b-1 of the pair 105 of signal sources 107a-1, 107b-1. In other words, the controller 109-1 can be designed, in the case in which the two input signals 103a-1, 103b-1 have values which, in conventional systems, would have the effect that both signal sources 107a-1, 107b-1 are activated simultaneously, to dispense with simultaneous activation of the signal sources 107a-1, 107b-1, in such a way that no superposition of the output signal components 101a, 101b provided by the signal sources 107a-1, 107b-1 can occur at the common load 111.

Within the meaning of the present application, a 'value' of the first input signal 103a-1 corresponds to a 'value' of the second input signal 103b-1 if the value of the first input signal 103a-1 forms a request for activating the first signal source 107a-1 and the value of the second input signal 103b-1 forms a request for activating the second signal source 107b-1, or if the value of the first input signal 103a-1 forms a request for deactivating the first signal source 107a-1 and the value of the second input signal 103b-1 forms a request for deactivating the second signal source 107b-1. In other words, the two mutually corresponding values of the input signals 103a-1, 103b-1 can also differ from one another as long as the purpose that they are intended to have (namely an activation or a deactivation of the respective signal source 107a-1, 107b) is identical.

In accordance with further exemplary embodiments, the controller 109-1 can be designed (on the basis both of the first input signal 103a-1 for the first signal source 107a-1 and of the second input signal 103b-1 for the second signal source 107b-1) to provide a first drive signal 115a-1 (also designated as Out, 1+) for the first signal source 107a-1 and (on the basis both of the first input signal 103a-1 for the first signal source 107a-1 and of the second input signal 103b-1 for the second signal source 107b-1) to provide a second drive signal 115b-1 (also designated as Out, 1−) for the second signal source 107b-1. In this case, the first drive signal 115a-1 can serve to activate and deactivate the first signal source 107a-1 and the second drive signal 115b-1 can serve to activate and deactivate the second signal source 107b-1.

In accordance with some exemplary embodiments, the first signal source 107a-1 can be designed to switch to its active state or to remain therein in reaction to a first value (for example a first digital value) of the first drive signal 115a-1 and to switch to its deactivated state or to remain therein in reaction to a second value (for example a value complementary to the first value) of the first drive signal 115a-1. Furthermore, the second signal source 107b-1 can be designed to switch to its active state or to remain therein in reaction to a first value (for example a first digital value) of the second drive signal 115b-1 and to switch to its deactivated state or to remain therein in reaction to a second value (which is for example complementary to the first value) of the second drive signal 115b-1.

In the present application, it is assumed for the sake of simplicity that the drivings for the first signal source 107a-1 and the second signal source 107b-1 are identical (i.e. that the same digital values of the input signals 103a-1, 103b-1 and of the drive signals 115a-1, 115b-1 of the two signal sources 107a-1, 107b-1 lead to an activation or a deactivation of the signal sources 107a-1, 107b-1). In accordance with further exemplary embodiments, however, the driving for the first signal source 107a-1 and the second signal source 107b-1 can also be different.

In accordance with some exemplary embodiments, the input signals 103a-1, 103b-1 and/or the drive signals 115a-1, 115b-1 can be digital signals. By way of example, the controller 109-1 can be designed to obtain the drive signals 115a-1, 115b-1 for the pair 105 of signal sources 107a-1, 107b-1 based on a logical (for example Boolean) combination of the input signals 103a-1, 103b-1. A digital signal can assume for example two possibly permissible values (logic 0 and logic 1).

Thus, in accordance with further exemplary embodiments, the controller 109-1 can be designed, in a case in which a value of the first input signal 103a-1 does not correspond to a value of the second input signal 103b-1 (e.g., such that one of the two signal sources 107a-1, 107b-1 is intended to be activated) or in a case in which a value of the first input signal 103a-1 is not equal to a value of the second input signal 103b-1 (e.g., such that one of the two signal sources 107a-1, 107b-1 is intended to be activated), to provide the first input signal 103a-1 as drive signal 115a-1 for the first signal source 107a-1 and to provide the second input signal 103b-1 as second drive signal for the second signal source 107b-1. In other words, the controller 109-1 can be designed to switch the input signals 103a-1, 103b-1 through to the signal sources 107a-1, 107b-1 as the drive signals 115a-1, 115b-1, in cases in which, on account of the applied input signals 103a-1, 103b-1, only one of the two signal sources 107a-1, 107b-1 is intended to be activated, As already explained, the controller 109-1 can be designed to receive the input signals 103a-1, 103b-1 as digital input signals 103a-1, 103b-1 and, based on a logical combination of the received digital input signals 103a-1, 103b-1, to provide the first drive signal 115a-1 as a first digital drive signal for activating and deactivating the first signal source 107a-1 and to provide the second drive signal 115b-1 as a second digital drive signal for activating and deactivating the second signal source 107b-1.

In this respect, FIG. 1B shows a truth table as to how the logical combination of the input signals 103a-1, 103b-1 can be carried out by the controller 109-1. It becomes apparent from FIG. 1B that, in the cases in which the input signals 103a-1, 103b-1 have a same value (for example digital 0 or digital 1), the controller 109-1 provides the drive signals 115a-1, 115b-1 in such a way that the signal sources 107a-1, 107b-1 switch to their deactivated state or remain therein (it being assumed that, in the case of the digital value 0 of the associated drive signal 115a-1, 115b-1, the respective signal source 107a-1, 107b-1 switches to its deactivated state or remains therein). Furthermore, it becomes apparent that, in the cases in which the input signals 103a-1, 103b-1 have different values (for example complementary digital values), the values of the drive signals 115a-1, 115b-1 are equal to the values of the associated input signals 103a-1, 103b-1.

Thus, the controller 109-1 is designed to provide the drive signals 115a-1, 115b-1 such that, in the case in which the first input signal 103a-1 has the digital value 0 and the second input signal 103b-1 has the digital value 1, the first drive signal 115a-1 has a digital value which leads to the deactivation of the first signal source 107a-1 (digital value 0 in the example) and the second drive signal 115b-1 has a digital value which leads to the activation of the second signal source 107b-1 (digital value 1 in the example). Furthermore, the controller 109-1 is designed to provide the drive signals 115a-1, 115b-1 such that, in the case in which the first input signal 103a-1 has the digital value 1 and the second input signal 103b-1 has the digital value 0, the first drive signal 115a-1 has a digital value which leads to the activation of the first signal source 107a-1 (digital value 1 in the example) and the second drive signal 115b-1 has a digital value which leads to the deactivation of the second signal source 107b-1 (digital value 0 in the example).

It will be appreciated that complementary realizations with respect to the realization shown in FIG. 1B are also possible in accordance with further exemplary embodiments. In such embodiments the complementary realizations ensure that in the case in which the input signals 103a-1, 103b-1 have values which would have the effect that both signal sources 107a-1, 107b-1 are activated simultaneously, instead of simultaneous activation of the two signal sources 107a-1, 107b-1, neither of the two signal sources 107a-1, 107b-1 is activated, in order to avoid common-mode signals which do not contribute to the information content of the resulting differential output signal 101.

To summarize, in the case of the controller 109-1, the logical combination of the input signals 103a-1, 103b-1 can be chosen in such a way that, for the cases in which a value of the first input signal 103a-1 corresponds to a value of the second input signal 103b-1 (for example is equal to the latter), the resulting drive signals 115a-1, 115b-1 for the first signal source 107a-1 and the second signal source 107b-1 in each case have a value (for example digital value 0) for which the associated signal source 107a-1, 107b-1 switches to its deactivated state or remains therein.

As described above, in some embodiments the logical combination of the input signals 103a-1, 103b-1 can be chosen in such a way that, for the cases in which a value of the first input signal 103a-1 does not correspond to a value of the second input signal 103b-1 (for example if these values are complementary to one another), a value of the first drive signal 115a-1 is based on the value of the first input signal 103a-1 (for example corresponds to the latter) and a value of the second drive signal 115b-1 is based on the value of the second input signal 103b-1 (for example corresponds to the latter).

Figure 1C:
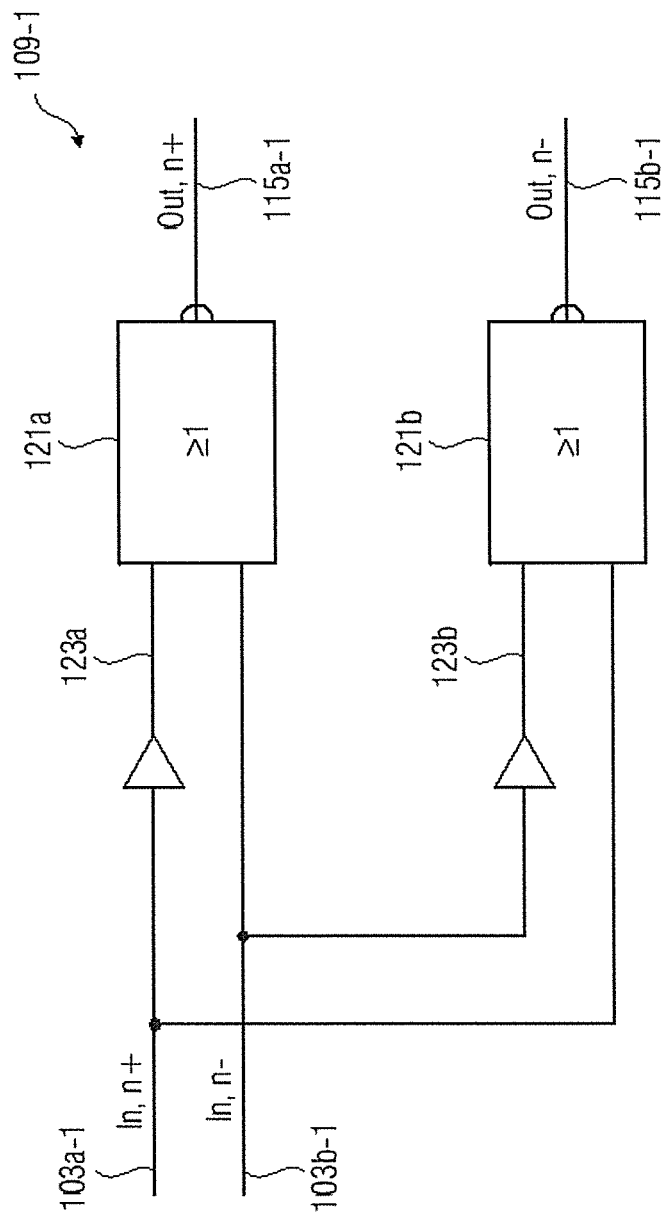
FIG. 1C shows a block diagram of one possible implementation of a controller such as can be used in exemplary embodiments of the present disclosure.

FIG. 1C shows a block diagram of one possible implementation of the controller 109-1 for the case of the use of digital input signals 103a-1, 103b-1 and digital drive signals 115a-1, 115b-1. As is evident from FIG. 1C, the controller 109-1 can be designed to obtain the first drive signal 115a-1 based on a first NOR combination 121a of a negated version 123a of the first input signal 103a-1 and of a non-negated version of the second input signal 103b-1. Furthermore, the controller 109-1 can be designed to obtain the second drive signal 115b-1 based on a second NOR combination 121b of a negated version 123b of the second input signal 103b-1 and of a non-negated version of the first input signal 103a-1. The logical combination shown in FIG. 1C forms one possible implementation of the truth table shown in FIG. 1B, wherein, as already described, it is assumed that the implementation of the two signal sources 107a-1, 107b-1 is chosen to be identical with regard to their driving, that is to say that the same digital values of the drive signals 115a-1, 115b-1 lead to an activation or a deactivation of the respective signal source 107a-1, 107b-1.

In accordance with further exemplary embodiments, other logical combinations are, of course, also possible, which make it possible that, for the case in which the input signals 103a-1, 103b-1 predefine an activation of both signal sources

107a-1, 107b-1, neither of the two signal sources 107a-1, 107b-1 is activated. In this case the logical combination can furthermore be designed such that, in the cases in which the input signals 103a-1, 103b-1 assume values for which one of the two signal sources 107a-1, 107b-1 is intended to be activated, this respective signal source 107a-1, 107b-1 is also activated.

Another possibility for implementing the controller 109-1 is a 2-bit multiplexer (e.g., between all positive and negative bits). The 2-bit multiplexer may generate a digital value 0 for the two drive signals 115a-1, 115b-1 in the case in which the drive signals 115a-1, 115b-1 would actually assume the digital value 1, which would lead to an activation of both signal sources 107a-1, 107b-1.

The presented implementation of the logical combination of the input signals 103a-1, 103b-1 thus makes it possible to eliminate the common-mode component in the resulting differential output signal 101. In other words, exemplary embodiments of the present disclosure make it possible to cancel digital bits (in the input signals 103a-1, 103b), which would have the effect that signal portions (for example currents) would flow into both terminals 113a, 113b (for example also designated as positive side and negative side) of the common load 111.

Figure 2:
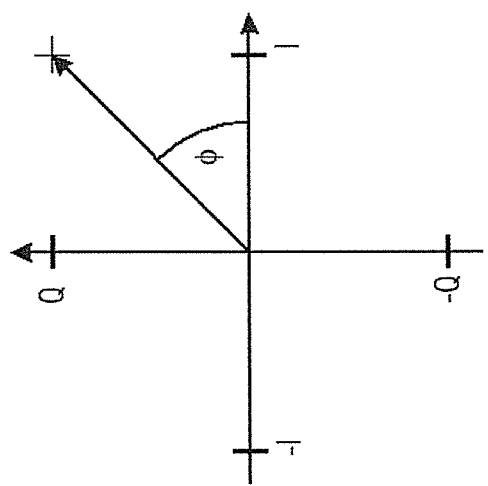
FIG. 2 shows diagrams for illustrating the generation of a common-mode signal.
Figure 2:
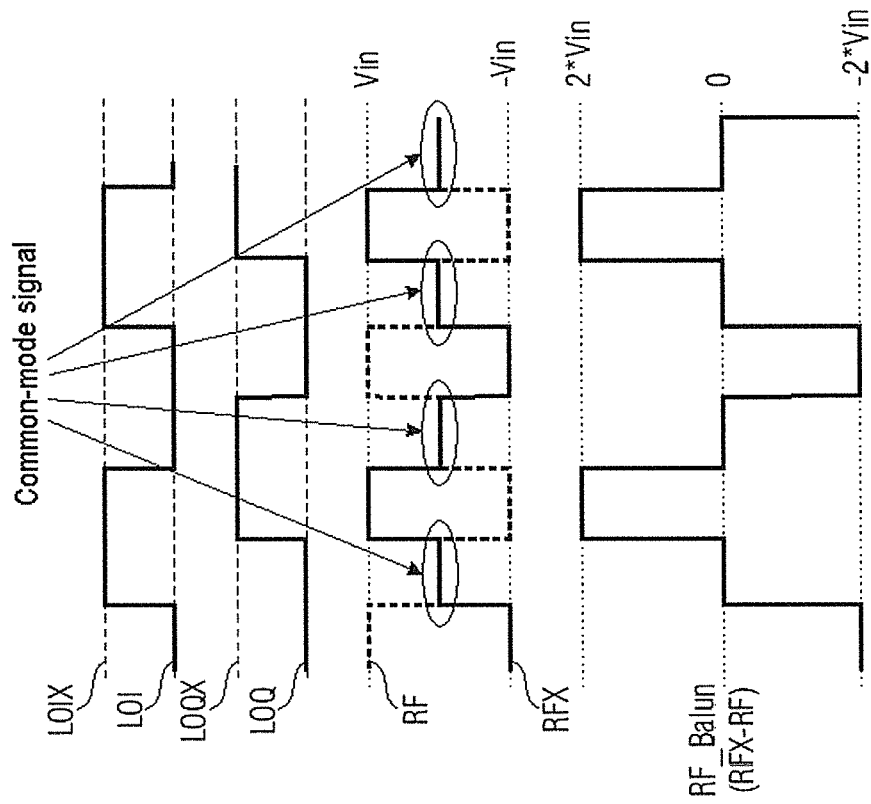

FIG. 2 shows, how in conventional vector modulators, a common-mode signal is generated on account of the overlap of the mutually phase-shifted clock signals for the I-portion and the Q-portion. LOI and LOIX are in this case the clock components of the differential clock signal for the I-component and LOQ and LOQX are the clock components of the differential clock signal for the Q-component. The differential clock signal for the I-component and the differential clock signal for the Q-component are phase-shifted by 90°. It becomes clear that common-mode portions arise in the resulting output signal components RF and RFX. The common-mode portions cancel one another in the resulting differential output signal (RFX−RF) and, therefore, do not contribute to the information content of the resulting output signal. Exemplary embodiments of the present disclosure (e.g., device 100) can be used in radio-frequency modulators, for example, in order to be able to avoid the disturbing common-mode signals shown in FIG. 2.

In general, exemplary embodiments of the present disclosure can form differential digital amplifiers or be part thereof.

Figure 3:
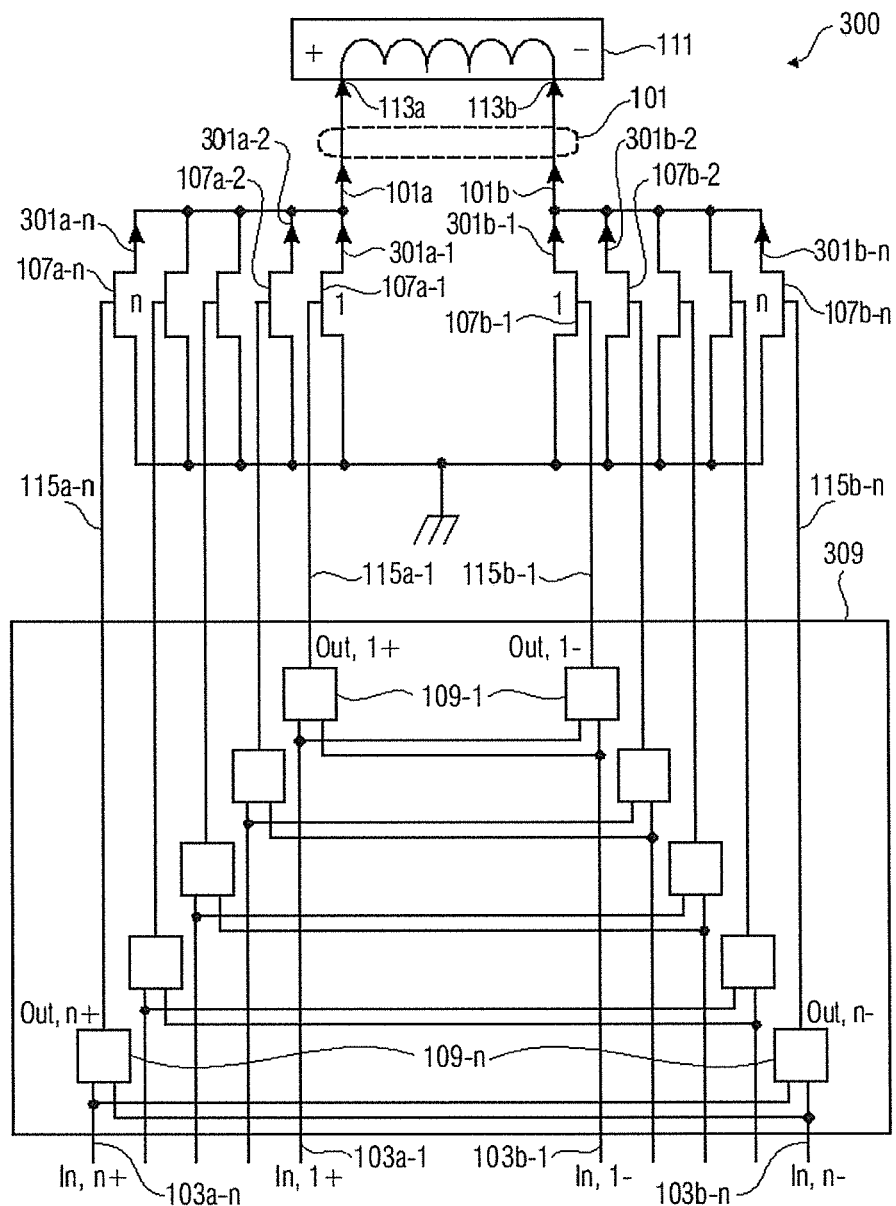
FIG. 3 shows a block diagram of a device in accordance with a further exemplary embodiment of the present disclosure.

In this respect, FIG. 3 shows a block diagram of a device 300 in accordance with a further exemplary embodiment of the present disclosure. The device 300 may operate as a differential digital radio-frequency amplifier or digital-to-analogue converter with common-mode suppression.

The device 300 forms a possible extension of the device 100 shown in FIG. 1A with regard to the fact that the device 300 comprises a plurality of pairs of signal sources 107a-1 to 107a-n, 107b-1 to 107b-n instead of one pair of signal sources. Accordingly, a controller 309 of the device 300 is also designed to activate or deactivate the signal sources of the plurality of pairs of signal sources 107a-1 to 107a-n, 107b-1 to 107b-n depending on the plurality of input signals 103a-1 to 103a-n, 103b-1 to 103b-n.

Each of the pairs of signal sources of the device 300 shown in FIG. 3 has a first activatable signal source 107a-1 to 107a-n for providing a portion 301a-1 to 301a-n of the first output signal component 101. Furthermore, each pair of signal sources has a second activatable signal source 107b-1 to 107b-n for providing a portion 301b-1 to 301b-n of the second output signal component 101b. The controller 309 is operably coupled to the plurality of pairs of signal sources and is configured to activate either the first signal source 107a-1 to 107a-n or the second signal source 107b-1 to 107b-n of a (or each) pair of signal sources depending on the plurality of input signals 103a-1 to 103a-n and 103b-1 to 103b-n. In other words, the device 300 shown in FIG. 3 differs from the device 100 shown in FIG. 1A in that the device 300 has a plurality of pairs of signal sources, wherein, as also already in the case of the device 100 in FIG. 1A, the controller 309 of the device 300 at an instant either activates none of the signal sources of a pair of signal sources or activates a maximum of one of the signal sources of a pair of signal sources. In this case, the first signal sources 107a-1 to 107a-n of the pairs of signal sources can be connected to the first terminal 113a of the common load 111, such that the first output signal component 101a is based on a superposition of the portions 301a-1 to 301a-n provided by the first signal sources 107a-1 to 107a-n. Furthermore, the second signal sources 107b-1 to 107b-n of the pairs of signal sources can be connected to the second terminal 113b of the common load 111, such that the second output signal component 101b is based on a superposition of the portions 301b-1 to 301b-n provided by the second signal sources 107b-1 to 107b-n.

In other words, the first signal sources 107a-1 to 107a-n are coupled to a first common terminal 113a, at which the first output signal component 101a can be tapped off, and the second signal sources 107b-1 to 107b-n are coupled to a second common terminal 113b, at which the second output signal component 101b can be tapped off.

The controller 309 can be designed to (simultaneously) activate a plurality of signal sources of the pairs of signal sources depending on the plurality of input signals 103a-1 to 103a-n (for the first signal sources 107a-1 to 107a-n) and 103b-1 to 103b-n (for the second signal sources 107b-1 to 107b-n), such that, apart from changeover instants, at an instant either no signal source or a maximum of one signal source of each pair of signal sources is activated. In other words, the device 300 can be designed in such a way that a plurality of the first signal sources 107a-1 to 107a-n and also a plurality of the second signal sources 107b-1 to 107b-n are simultaneously active at one point in time, but (apart from at changeover instants) at no point in time is more than one signal source of a pair of signal sources active.

This makes it possible that (apart from at changeover instants) at no point in time the both signal sources of a pair of signal sources provide a portion of the respective output signal component 101a, 101b, which would mutually cancel one another in the resulting differential output signal 101 and, therefore, would not contribute to the information content of the resulting differential output signal 101. As can be seen from FIG. 3, the controller 309 can be designed to receive a dedicated input signal 103a-1 to 103a-n, 103b-1 to 103b-n for each signal source of the pairs of signal sources and to provide, for each signal source of the pairs of signal sources, a dedicated drive signal 115a-1 to 115a-n, 115b-1 to 115b-n for driving the respective signal source.

In this case, the controller 309 can determine drive signals (e.g. the drive signals 115a-1, 115b-1) for the signal sources of a pair of signal sources (e.g. for the signal sources 107a-1, 107b-1) depending on the input signals (e.g. the input signals 103a-1, 103b-1) for the signal sources of this pair of signal sources and, in particular, independently of input signals (e.g. the input signals 103a-2 to 103a-n, 103b-2 to 103b-n) for the signal sources of the remaining pairs of signal sources (e.g. the signal sources 107a-2 to 107a-n, 107b-2 to 107b-n).

The provision of the drive signals 115a-1 to 115a-n, 115b-1 to 115b-n based on the input signals 103a-1 to 103a-n, 103b-1 to 103b-n can therefore be effected for each pair of signal sources independently of the other pairs of signal sources. Therefore, the controller 309 can have one controller 109-1 to 109-n as shown in FIG. 1A for each pair of signal sources of the device 300 and can have, for example, for each pair of signal sources a logical combination corresponding to the true table shown in FIG. 1B and can be implemented, for example, as shown in FIG. 1C.

In other words, the controller 309 can have a plurality of individual controllers 109-1 to 109-n, wherein each of the individual controllers 109-1 to 109-n is designed like the controller 109-1 described in FIG. 1A. Therefore, the descriptions given for the controller 109-1 are also applicable to the individual controllers 109-1 to 109-n.

To summarize, the controller 309 can be designed to receive, for each pair of signal sources 107a-1 to 107a-n, 107b-1 to 107b-n, an assigned pair of input signals 103a-1 to 103a-n, 103b-1 to 103b-n and to activate and to deactivate the signal sources of each pair of signal sources 107a-1 to 107a-n, 107b-1 to 107b-n depending on its assigned pair of input signals 103a-1 to 103a-n, 103b-1 to 103b-n, independently of the remaining pairs of input signals which are assigned to the remaining pairs of signal sources.

A pair of signal sources can be distinguished by the fact that magnitudes of the portions provided by the signal sources of this pair of signal sources are equal (for example within a tolerance range of ±1%, ±5%, ±10% or ±20% of the portion provided by a first signal source of the pair). Thus, by way of example, a magnitude of a first portion 301a-1 of the first output signal component 101a which is provided by the first signal source 107a-1 of the first pair of signal sources 107a-1, 107b-1 can be equal in magnitude to a first portion 301b-1 of the second output signal component 101b which is provided by the second signal source 107b-1 of the first pair of signal sources 107a-1, 107b-1.

In accordance with some exemplary embodiments, the signal sources 107a-1 to 107a-n, 107b-1 to 107b-n can be designed in such a way that the portions 301a-1 to 301a-n, 301b-1 to 301b-n provided by said signal sources 107a-1 to 107a-n, 107b-1 to 107b-n are equal at least in terms of magnitude (within a tolerance range). In this case, the tolerance range can be, for example, ±1%, ±5%, ±10% or ±20% of the first portion 301a-1. Thus, the signal sources 107a-1 to 107a-n and the signal sources 107b-1 to 107b-n can be designed, for example, with a sole difference that a sign of the portions 301a-1 to 301a-n provided by the first signal sources 107a-1 to 107a-n differs from a sign of the portions 301b-1 to 301b-n provided by the second signal sources 107b-1 to 107b-n.

The configuration of the signal sources 107a-1 to 107a-n, 107b-1 to 107b-n such that the portions 301a-1 to 301a-n, 301b-1 to 301b-n provided thereby are identical in terms of magnitude corresponds in this case to a thermal coder principle. In other words, in accordance with some exemplary embodiments, in order to generate a balanced differential output signal 101, the respective bits can be implemented in a thermometer-coded fashion.

In accordance with further exemplary embodiments, a binary coding of the bits is also possible. Thus, by way of example, the first signal source 107a-1 of the first pair of signal sources 107a-1, 107b-1 can be designed to provide a first basic signal (for example a first basic current $I_1$) as portion 301a-1 of the first output signal component 101a and the first signal sources (for example signal sources 107a-2 to 107a-n) of the further pairs of signal sources can in this case be designed to provide the first basic signal multiplied with $2^m$ (m=1 ... N) as portion 301a-1 to 301a-n of the first output signal component 101a. Thus, by way of example, a first signal source 107a-2 of a second pair of signal sources 107a-2, 107b-2 can be designed to provide double the first basic signal (for example $2*I_1$) as portion 301a-2 of the first output signal component 101a.

Analogously thereto, a first signal source 107a-n of an n-th pair of signal sources 107a-n, 107b-n can be designed to provide n times the first basic signal e.g., $n*I_1$) as portion 301a-n of the first output signal component 101a.

In this case, the binary scaling of the portions 301a-1 to 301a-n, 301b-1 to 301b-n provided by the signal sources 107a-1 to 107a-n, 107b-1 to 107b-n can apply both to the portions 301a-1 to 301a-n provided by the first signal sources 107a-1 to 107a-n and to the portions 301b-1 to 301b-n provided by the second signal sources 107b-1 to 107b-n.

Thus, the second signal source 107b-1 of the first pair of signal sources 107a-1, 107b-1 can be designed to provide a second basic signal (which, by way of example, can be equal in magnitude to the first basic signal) as portion of the second output signal component 101b and the second signal sources 107b-1 to 107b-n of the further pairs of signal sources can be designed to provide the second basic signal multiplied with $2^m$ (where m=1 ... N) as portion 301b-2 to 301b-n of the second output signal component 101b. Thus, by way of example, a second signal source 107b-2 of the second pair of signal sources 107a-2, 107b-2 can be designed to provide double the second basic signal (for example $2*I_2$) as portion 301b-2 of the second output signal component 101b. A second signal source 107b-n of the n-th pair of signal sources 107a-n, 107b-n can be designed to provide n times the second basic signal (e.g., $n*I_2$) as portion 301b-1 of the second output signal component 101b.

Although the signal sources 107a-1 to 107a-n, 107b-1 to 107b-n are illustrated as transistors in a simplified manner in the exemplary embodiment shown in FIG. 3, a different implementation of the signal sources 107a-1 to 107a-n, 107b-1 to 107b-n is also possible in exemplary embodiments of the present disclosure.

In accordance with one exemplary embodiment of the present disclosure, the signal sources 107a-1 to 107a-n, 107b-1 to 107b-n can be current sources. In accordance with further exemplary embodiments, however, the signal sources 107a-1 to 107a-n, 107b-1 to 107b-n can also be voltage sources.

In accordance with some exemplary embodiments, the device 300 shown in FIG. 3 can form a differential digital RF amplifier, for example, which can also be designated as a signal generator or radio-frequency digital-to-analogue converter. Use is made of n balanced bits in order to generate a differential signal current (the differential output signal 101) which is passed into the positive or negative input (the terminals 113a, 113b) of a common load 111 comprising an inductive load having a differential inductance. In order to obtain a balanced differential output signal 101, said n bits (as already described above) can be implemented, for example, either in a binary coating method or in a thermometer coding method. The device 300 described makes it possible to cancel common-mode portions in the differential digital input signals 103a-1 to 103a-n, 103b-1 to 103b-n before the output signal components 101a, 101b are actually provided at the differential inductance (or a differential transformer). Therefore, exemplary embodiments of the present disclosure provide a circuit which is designed to carry out a common-mode suppression already in the digital domain of the amplifier, generator or radio-frequency analogue-to-digital converter.

In other words, the controller 309 performs (or more precisely the individual controllers 109-1 to 109-n perform) a common-mode suppression already in the digital domain by logically combining the input signals 103a-1 to 103a-n, 103*b*-1 to 103*b*-*n*. To put it more precisely, each of the individual controllers 109-1 to 109-*n* carries out a common-mode suppression in the received digital input signals 103*a*-1 to 103*a*-*n*, 103*b*-1 to 103*b*-*n* for its respectively assigned pair of signal sources (independently of the other pairs of signal sources).

The device 300 shown in FIG. 3 therefore carries out a cancellation of digital bits which would lead to a current into both sides of the common load 111 comprising the inductive load, to be precise by means of a logical combination of the digital n-bit signals of the two arrays (having the first signal sources 107*a*-1 to 107*a*-*n* and the second signal sources 107*b*-1 to 107*b*-*n*) which are used to generate the differential output signal 101.

One advantage of exemplary embodiments of the present disclosure, and in particular of the switching logic illustrated in FIG. 3, is that no DC and signal current which would be suppressed anyway by the inductive differential load (e.g., of common load 111) of the device 300 (e.g., the differential digital RF amplifier) is wasted as a result of the generation of a common-mode component.

Exemplary embodiments can be used for example in digital IQ radio-frequency digital-to-analogue converter architectures. Further exemplary embodiments can be applied to calibrated signals, to signals provided with an interference portion (so-called predistorted signals), or to signals which have been subjected to noise shaping, in which a common-mode component has been introduced in order to modify an original (common-mode-free) signal.

Further exemplary embodiments of the present disclosure can operate as a digital vector mixer (for example a digital IQ mixer).

Furthermore, exemplary embodiments of the present disclosure can be used for all types of differential loads (such as, for example, inductive loads, resistive loads and/or capacitive loads).

Furthermore, exemplary embodiments of the present disclosure can be used in digital phase modulator architectures in order to eliminate digital common-mode components.

Furthermore, exemplary embodiments of the present disclosure can also be used in so-called "mixed signal" digital-to-analogue converters.

Furthermore, further exemplary embodiments of the present disclosure can be used in multi-path digital power amplifier architectures, e.g. for so-called linear gain architectures with non-linear components (LING).

Therefore, exemplary embodiments of the present disclosure also provide a (differential and/or digital) amplifier.

Further exemplary embodiments of the present disclosure provide a radio-frequency modulator (for example comprising a device in accordance with one exemplary embodiment of the present disclosure).

Figure 4:
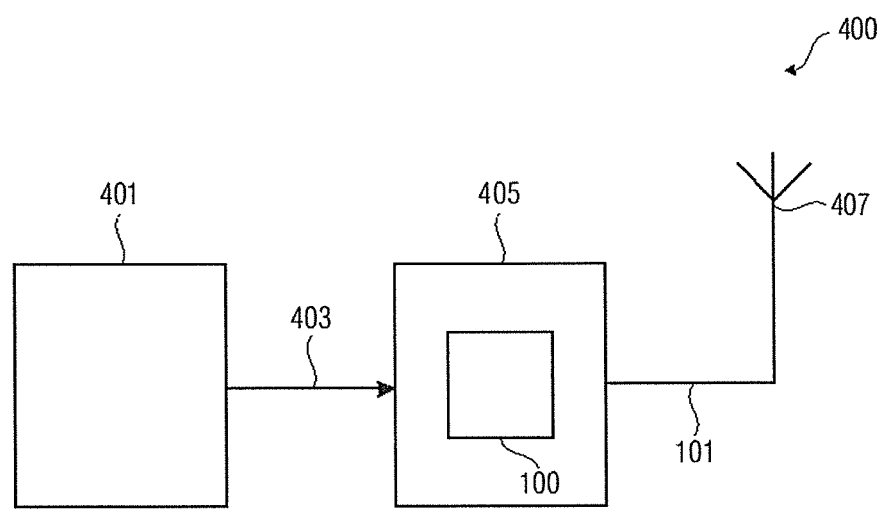
FIG. 4 shows a block diagram of a mobile radio device in accordance with one exemplary embodiment of the present disclosure.

FIG. 4 shows a block diagram of a mobile radio device 400 in accordance with a further exemplary embodiment of the present disclosure.

The mobile radio device 400 comprises a baseband processor 401, which is designed to provide a digital baseband signal 403. Furthermore, the mobile radio device 400 comprises a radio-frequency mobile radio modulator 405. In some exemplary embodiments, the radio-frequency mobile radio modulator 405 comprises the device 100. In accordance with further exemplary embodiments, the radio-frequency mobile radio modulator 405 can, however, also comprise another device in accordance with one exemplary embodiment of the present disclosure, such as the device 300, for example.

The radio-frequency mobile radio modulator 405 is coupled to the baseband processor 401 and is designed to provide the plurality of input signals for the device 100 based on the received digital baseband signal 403.

Furthermore, the mobile radio device 400 comprises an antenna 407. The antenna 407 is coupled to the radio-frequency mobile radio modulator 405 and thus to the device 100 and is designed to forward or transmit the differential output signal 101 provided by the device 100 (for example via an air interface).

In accordance with some exemplary embodiments, the radio-frequency modulator 405 can be a vector modulator or a polar modulator.

In accordance with further exemplary embodiments, the mobile radio device 400 can be a portable mobile radio device 400.

By way of example, the mobile radio device 400 can be designed for (wireless) voice communication and/or data communication (for example in accordance with a mobile radio communication standard) with a further (portable) mobile radio device and/or a mobile radio base station.

The mobile radio device 400 can be, for example, a mobile handheld device such as, for example, a mobile telephone ("cellphone"), a so-called smart phone, a tablet PC, a broadband modem, a notebook or a laptop, but also a router or a PC.

Figure 5:
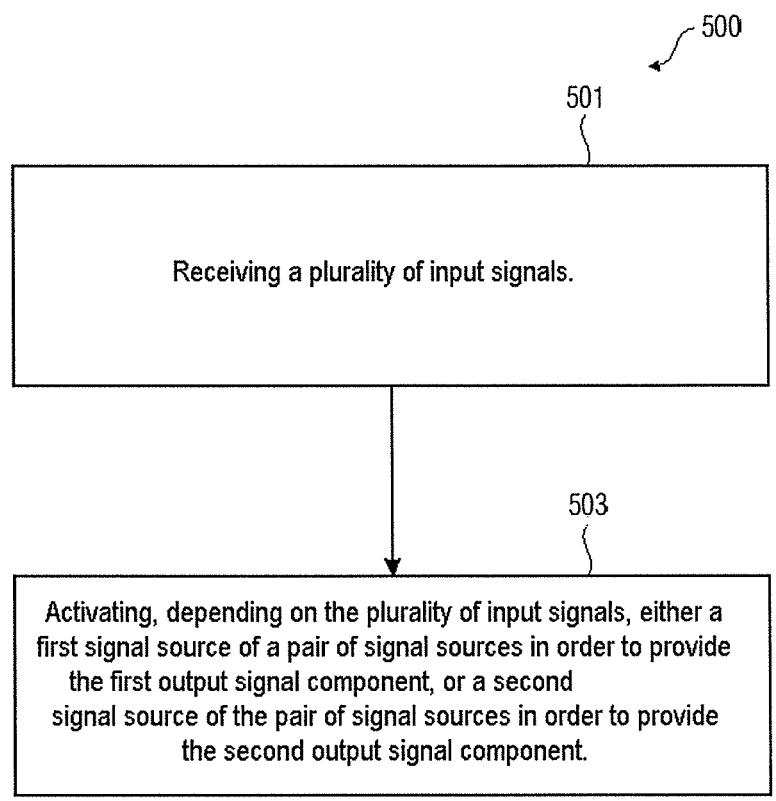
FIG. 5 shows a flow chart of a method in accordance with a further exemplary embodiment of the present disclosure.

FIG. 5 shows a flow chart of a method 500 in accordance with one exemplary embodiment of the present disclosure.

The method 500 for providing a differential output signal having a first output signal component and a second output signal component comprises a step 501 of receiving a plurality of input signals.

Furthermore, the method 500 comprises a step 503 of activating, depending on the plurality of input signals, either a first signal source of a pair of signal sources in order to provide the first output signal component, or a second signal source of the pair of signal sources in order to provide the second output signal component.

In accordance with further exemplary embodiments, step 503 can be effected in such a way that, apart from at changeover instants, that any instant either none of the two signal sources is active or a maximum of one of the two signal sources of the pair of signal sources is active.

The method 500 can be extended by all features of the devices described herein.

Although some aspects have been described in connection with a device, it goes without saying that these aspects also constitute a description of the corresponding method, such that a block or a component of a device should also be understood as a corresponding method step or as a feature of a method step. Analogously to this, aspects which have been described in connection with or as a method step also constitute a description of a corresponding block or detail or feature of a corresponding device.

Depending on specific implementation requirements, exemplary embodiments of the disclosure can be implemented in hardware or in software. The implementation can be carried out using a digital storage medium, for example a floppy disk, a DVD, a Blu-ray disc, a CD, a ROM, a PROM, an EPROM, an EEPROM or a FLASH memory, a hard disk or some other magnetic or optical storage unit, on which electronically readable control signals are stored which can interact or interact with a programmable computer system in such a way that the respective method is carried out. Therefore, the digital storage medium can be computer-readable. Some exemplary embodiments according to the disclosure therefore comprise a data carrier having electronically readable control signals that are able to interact with a programmable computer system in such a way that one of the methods described herein is carried out.

Generally, exemplary embodiments of the present disclosure can be implemented as a computer program product comprising a program code, wherein the program code is effective to the extent of carrying out one of the methods when the computer program product runs on a computer. The program code can, for example, also be stored on a machine-readable carrier.

Other exemplary embodiments comprise the computer program for carrying out one of the methods described herein, wherein the computer program is stored on a machine-readable carrier.

In other words, one exemplary embodiment of the method according to the disclosure is therefore a computer program having a program code for carrying out one of the methods described herein when the computer program runs on a computer. A further exemplary embodiment of the methods according to the disclosure is therefore a data carrier (or a digital storage medium or a computer-readable medium) on which the computer program for carrying out one of the methods described herein is recorded.

A further exemplary embodiment of the method according to the disclosure is therefore a data stream or a sequence of signals which represents or represent the computer program for carrying out one of the methods described herein. The data stream or the sequence of signals can be configured for example to the effect of being transferred via a data communication connection, for example via the Internet.

A further exemplary embodiment comprises a processing unit, for example a computer or a programmable logic component, which is configured or adapted to the effect of carrying out one of the methods described herein.

A further exemplary embodiment comprises a computer on which the computer program for carrying out one of the methods described herein is installed.

In some exemplary embodiments, a programmable logic component (for example a field programmable gate array, an FPGA) can be used to carry out some or all functionalities of the methods described herein. In some exemplary embodiments, a field programmable gate array can interact with a microprocessor in order to carry out one of the methods described herein. Generally, the methods in some exemplary embodiments are carried out on the part of an arbitrary hardware device. The latter can be universally usable hardware such as a computer processor (CPU) or hardware specific to the method, such as an ASIC, for example.

The exemplary embodiments described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the following patent claims and not by the specific details that have been presented based on the description and the explanation of the exemplary embodiments herein.

The invention claimed is:

1. A device for providing a differential output signal having a first output signal component and a second output signal component based on a plurality of input signals, comprising:
a first pair of signal sources comprising a first signal source for providing at least a portion of the first output signal component and a second signal source for providing at least a portion of the second output signal component, wherein the first output signal component and the second output signal component are distinct output signal components that define the differential output signal; and
a controller, which is operably coupled to the first pair of signal sources and is configured to activate, via a plurality of drive signals, at most one of the first signal source or the second signal source of the first pair of signal sources, based at least in part on the plurality of input signals,
wherein the plurality of input signals indicate activation or deactivation of the first signal source and activation or deactivation of the second signal source, and
wherein, in response to the plurality of input signals indicating activation of the first signal source and activation of the second signal source, the controller is configured to transmit the plurality of drive signals to cause the first signal source and the second signal source to switch to or to remain in a deactivated state.

2. The device according to claim 1,
wherein the device further comprises a common load, at which the device provides the differential output signal; and
wherein the first pair of signal sources is connected to the common load to superimpose the first output signal component and the second output signal component at the common load.

3. The device according to claim 2,
wherein the common load comprises an inductive load, a capacitive load, or a resistive load; and wherein the first signal source of the pair of signal sources is connected to a first terminal of the inductive, capacitive, or resistive load and the second signal source is connected to a second terminal of the inductive, capacitive, or resistive load.

4. The device according to claim 1,
wherein a magnitude of a current or of a voltage which is provided by the first signal source of the first pair of signal sources in its activated state is within a tolerance range equal to a current or a voltage which is provided by the second signal source of the first pair of signal sources in its activated state.

5. The device according to claim 1,
wherein a sign of a current or of a voltage which is provided by the first signal source of the first pair of signal sources differs from a sign of a current or of a voltage which is provided by the second signal source of the first pair of signal sources.

6. The device according to claim 1,
wherein the controller is configured to individually activate the first pair of signal sources such that, apart from changeover instants, at any instant either none of the signal sources of the first pair of signal sources is activated or a maximum of one signal source of the signal sources of the first pair of signal sources is activated.

7. The device according to claim 1,
wherein the controller is configured to receive a first input signal for the first signal source of the first pair of signal sources and to receive a second input signal for the second signal source of the first pair of signal sources and, in a case in which a value of the first input signal corresponds to a value of the second input signal, independently of the value of the first input signal and the value of the second input signal, to activate none of the signal sources of the first pair of signal sources.

8. The device according to claim 1,
wherein the controller is configured to receive a first input signal for the first signal source of the first pair of signal sources and to receive a second input signal for the second signal source of the first pair of signal sources and, in a case in which a value of the first input signal differs from a value of the second input signal, to provide the first input signal as a first drive signal of the plurality of drive signals for the first signal source of the first pair of signal sources and to provide the second input signal as a second drive signal of the plurality of drive signals for the second signal source of the first pair of signal sources.

9. The device according to claim 1,
wherein the controller is configured to receive the plurality of input signals as digital input signals and, based on a logical combination of the received digital input signals, to provide both a first digital drive signal of the plurality of drive signals for activating and deactivating the first signal source of the first pair of signal sources and a second digital drive signal of the plurality of drive signals for activating and deactivating the second signal source of the first pair of signal sources.

10. The device according to claim 9,
wherein the first signal source is configured to switch to its active state or to remain therein in reaction to a first value of the first digital drive signal and to switch to its deactivated state or to remain therein in reaction to a second value of the first digital drive signal; and
wherein the second signal source is configured to switch to its active state or to remain therein in reaction to a first value of the second digital drive signal and to switch to its deactivated state or to remain therein in reaction to a second value of the second digital drive signal.

11. The device according to claim 9,
wherein the logical combination of the input signals is such that, for the cases in which a value of the first input signal corresponds to a value of the second input signal, the first and second digital drive signals each have a value for which the associated signal source switches to its deactivated state or remains therein.

12. The device according to claim 9,
wherein the logical combination of the input signals is such that, for the cases in which a value of the first input signal does not correspond to a value of the second input signal, a value of the first digital drive signal is based on the value of the first input signal and a value of the second digital drive signal is based on the value of the second input signal.

13. The device according to claim 9,
wherein the controller is configured to obtain the first digital drive signal based on a first NOR combination of a negated version of the first input signal and of a non-negated version of the second input signal and to obtain the second digital drive signal based on a second NOR combination of a negated version of the second input signal and of a non-negated version of the first input signal.

14. The device according to claim 1,
wherein the device comprises a plurality of pairs of signal sources, wherein each pair of signal sources of the plurality of pairs comprises a first signal source for providing a portion of the first output signal component and a second signal source for providing a portion of the second output signal component; and
wherein the controller is operably coupled to the plurality of pairs of signal sources and is configured to activate either the first signal source or the second signal source of each pair of signal sources depending on the plurality of input signals.

15. The device according to claim 14,
wherein first signal sources of the plurality of pairs of signal sources are coupled to a first common terminal, at which the first output signal component is configured to be tapped off, and second signal sources of the plurality of pairs of signal sources are coupled to a second common terminal, at which the second output signal component is configured to be tapped off.

16. The device according to claim 14,
wherein first signal sources of the pairs of signal sources are interconnected with one another in such a way in that the first output signal component is based on a superposition of the portions provided by the first signal sources; and
wherein second signal sources of the pairs of signal sources are interconnected with one another in such a way that the second output signal component is based on a superposition of the portions provided by the second signal sources.

17. The device according to claim 14,
wherein the controller is configured, depending on the plurality of input signals, to simultaneously activate a plurality of signal sources of the pairs of signal sources, but such that, apart from changeover instants, at any instant either no signal source or a maximum of one signal source of each pair of signal sources is activated.

18. The device according to claim 14,
wherein the controller is configured to receive, for a pair of signal sources, in each case an assigned pair of input signals and to activate and deactivate the signal sources of a pair of signal sources depending on its assigned pair of input signals, independently of the remaining pairs of input signals which are assigned to the remaining pairs of signal sources.

19. The device according to claim 14,
wherein, for a pair of signal sources, a magnitude of the portion of the first output signal component which is provided by a first signal source of the pair of signal sources in its activated state is within a tolerance range equal to a magnitude of the portion of the second output signal component which is provided by a second signal source of the pair of signal sources in its activated state.

20. The device according to claim 14,
wherein the portions of the first output signal component which are provided by the first signal sources of the pairs of signal sources in their active states are equal within a tolerance range; and
wherein the portions of the second output signal component which are provided by the second signal sources of the pairs of signal sources in their active state are equal within a tolerance range.

21. The device according to claim 14,
wherein the plurality of pairs of signal sources comprises the first pair of signal sources and m further pairs of signal sources, where m=1 ... N with N being a positive integer; and
wherein the first signal source of the first pair of signal sources is configured to provide a first basic signal as a portion of the first output signal component and the first signal sources of the m further pairs are configured to provide the basic signal multiplied with $2^m$ as a portion of the first output signal component; and
wherein the second signal source of the first pair of signal sources is configured to provide a second basic signal as a portion of the second output signal component and the second signal sources of the m further pairs are configured to provide the basic signal multiplied with $2^m$ as a portion of the second output signal component.

22. A radio-frequency (RF) mobile radio modulator comprising:
- a pair of RF signal sources comprising a first RF signal source for providing a first output signal component and a second RF signal source for providing a second output signal component; and
- a controller operably coupled to the pair of RF signal sources and configured to receive a plurality of input signals that indicate activation or deactivation of the first RF signal source and activation or deactivation of the second RF signal source, wherein, in response to the plurality of input signals indicating activation or deactivation of both the first RF signal source and the second RF signal source, the controller is further configured to cause both the first RF signal source and the second RF signal source to switch to or remain in a deactivated state, wherein, in response to the plurality of input signals indicating activation of both the first RF signal source and the second RF signal source, the controller is further configured to cause both the first RF signal source and the second RF signal source to switch to or remain in a deactivated state.

23. A mobile radio device comprising:
- a baseband processor configured to provide a digital baseband signal;
- a radio-frequency (RF) mobile radio modulator coupled to the baseband processor; and
- an antenna port configured to couple to an antenna, wherein the antenna port is coupled to the RF mobile radio modulator in order to receive and forward a differential output signal made up of first and second output signal components provided by the RF mobile radio modulator;
- wherein the RF mobile radio modulator comprises:
  - a pair of signal sources comprising a first signal source to provide the first output signal component and a second signal source to provide the second output signal component; and
  - a controller operably coupled to the pair of signal sources, wherein the controller is configured to receive, via the digital baseband processor, a first input signal that indicates activation or deactivation of the first signal source and a second input signal that indicates activation or deactivation of the second signal source,
  - wherein, in response to the first input signal and the second input signal both indicating activation, the controller is further configured to cause the first signal source and the second signal source to switch to or remain in a deactivated state,
  - wherein, in response to the first input signal and the second input signal both indicating deactivation, the controller is further configured to cause the first signal source and the second signal source to switch to or remain in a deactivated state, and
  - wherein, in response to only one of the first input signal and the second input signal indicating activation, the controller is further configured to activate the signal source for which activation is indicated by the respective input signal of the first input signal and the second input signal.

24. A method for providing a differential output signal having a first output signal component and a second output signal component, comprising:
- receiving a plurality of input signals;
- activating a first signal source in response to the plurality of input signals indicating activation of the first signal source and deactivation of a second signal source, wherein the first signal source generates the first output signal component when activated;
- activating the second signal source in response to the plurality of input signals indicating deactivation of the first signal source and activation of the second signal source, wherein the second signal source generates the second output signal component when activated; and
- causing both the first signal source and the second signal source to deactivate or remain in a deactivated state in response to the plurality of input signals indicating activation or deactivation of both the first signal source and the second signal source,
- wherein at most one of the first signal source and the second signal source is simultaneously active, and
- wherein the first output signal component and the second output signal component are distinct output signal components that define the differential output signal.

25. A computer readable medium comprising program code for carrying out the method according to claim 24 when the program code is executed on a computer.

26. A device for providing a differential output signal having a first output signal component and a second output signal component based on a plurality of input signals, comprising:
- a pair of signal sources comprising a first activatable signal source for providing the first output signal component and a second activatable signal source for providing the second output signal component; and
- a controller, which is operably coupled to the pair of signal sources and is configured to activate either the first signal source or the second signal source of the pair of signal sources depending on the plurality of input signals;
- wherein the controller is configured to receive the plurality of input signals as digital input signals that indicate activation of neither of the first or second signal sources, activation of one of the first or second signal sources, or activation of both of the first and second signal sources; and
- a common load, at which the device provides the differential output signal; and
- wherein the pair of signal sources is connected to the common load in such a way that the first output signal component and the second output signal component are superposed at the common load,
- wherein, in response to the digital input signals indicating activation of neither or one of the first or second signal sources, the controller is further configured to activate neither or one of the first or second signal sources as indicated by the digital input signals, and
- wherein, in response to the digital input signals indicating activation of both the first and second signal sources, the controller is further configured to cause both the first and second signal sources to deactivate or to remain deactivated.

* * * * *